United States Patent
Chiu et al.

(10) Patent No.: US 9,219,190 B2
(45) Date of Patent: Dec. 22, 2015

(54) SINGLE PHOTON SOURCE DIE AND METHOD OF MANUFACTURING THE SAME

(71) Applicant: ADVANCED OPTOELECTRONIC TECHNOLOGY, INC., Hsinchu Hsien 303 (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hien (TW)

( * ) Notice: Subject to any disclaimer, the term of this patent is extended or adjusted under 35 U.S.C. 154(b) by 0 days.

(21) Appl. No.: 14/480,868

(22) Filed: Sep. 9, 2014

(65) Prior Publication Data

US 2015/0069323 A1    Mar. 12, 2015

(30) Foreign Application Priority Data

Sep. 11, 2013    (CN) .......................... 2013 1 0410729

(51) Int. Cl.
*H01L 33/08* (2010.01)
*H01L 33/00* (2010.01)
*H01L 33/06* (2010.01)
*H01L 33/18* (2010.01)
*H01L 33/32* (2010.01)
*H01L 33/20* (2010.01)
*H01L 33/42* (2010.01)

(52) U.S. Cl.
CPC ........ *H01L 33/0075* (2013.01); *H01L 33/0095* (2013.01); *H01L 33/06* (2013.01); *H01L 33/18* (2013.01); *H01L 33/08* (2013.01); *H01L 33/20* (2013.01); *H01L 33/32* (2013.01); *H01L 33/42* (2013.01); *H01L 2933/0083* (2013.01)

(58) Field of Classification Search
CPC . H01L 33/0075; H01L 33/18; H01L 33/0095; H01L 33/06; H01L 33/42; H01L 33/08; H01L 2933/0083; H01L 33/20; H01L 33/32
See application file for complete search history.

(56) References Cited

U.S. PATENT DOCUMENTS

| | | |
|---|---|---|
| 2004/0056258 A1 | 3/2004 | Tadatomo et al. |
| 2010/0193813 A1 | 8/2010 | Kao et al. |
| 2011/0272671 A1* | 11/2011 | Skiba-Szymanska et al. .. 257/14 |
| 2012/0001210 A1 | 1/2012 | Mochizuki |
| 2012/0112160 A1 | 5/2012 | Chen et al. |

FOREIGN PATENT DOCUMENTS

| | | |
|---|---|---|
| TW | 201031019 A1 | 8/2010 |
| TW | 201128801 A | 8/2011 |
| TW | 201203601 A1 | 1/2012 |
| TW | 201220530 A1 | 5/2012 |

* cited by examiner

*Primary Examiner* — Roy Potter
*Assistant Examiner* — Paul Patton
(74) *Attorney, Agent, or Firm* — Novak Druce Connolly Bove + Quigg LLP (57) ABSTRACT

A single photon source die includes a first semiconductor layer, a plurality of columnar structures formed on the first semiconductor layer, a second semiconductor layer formed on the columnar structures. Each columnar structure includes a bottom layer, a single photon point layer and a connecting layer. The single photon point layer includes a plurality of single photon points.

20 Claims, 13 Drawing Sheets

SINGLE PHOTON SOURCE DIE AND METHOD OF MANUFACTURING THE SAME

CROSS-REFERENCE TO RELATED APPLICATIONS

This application claims priority to Chinese Patent Application No. 201310410729.1 filed on Sep. 11, 2013 in the State Intellectual Property Office Of The P.R.C, the contents of which are incorporated by reference herein.

FIELD

The disclosure relates to a single photon source die and a method of manufacturing the single photon source die.

BACKGROUND

A single photon source die includes a plurality of single photon points, certain positions and sizes of the single photon points need to be settled.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The only drawing is not necessarily to scale and the proportions of certain parts have been exaggerated to better illustrate details and features of the present disclosure. The description is not to be considered as limiting the scope of the embodiments described herein.

Figure 1:
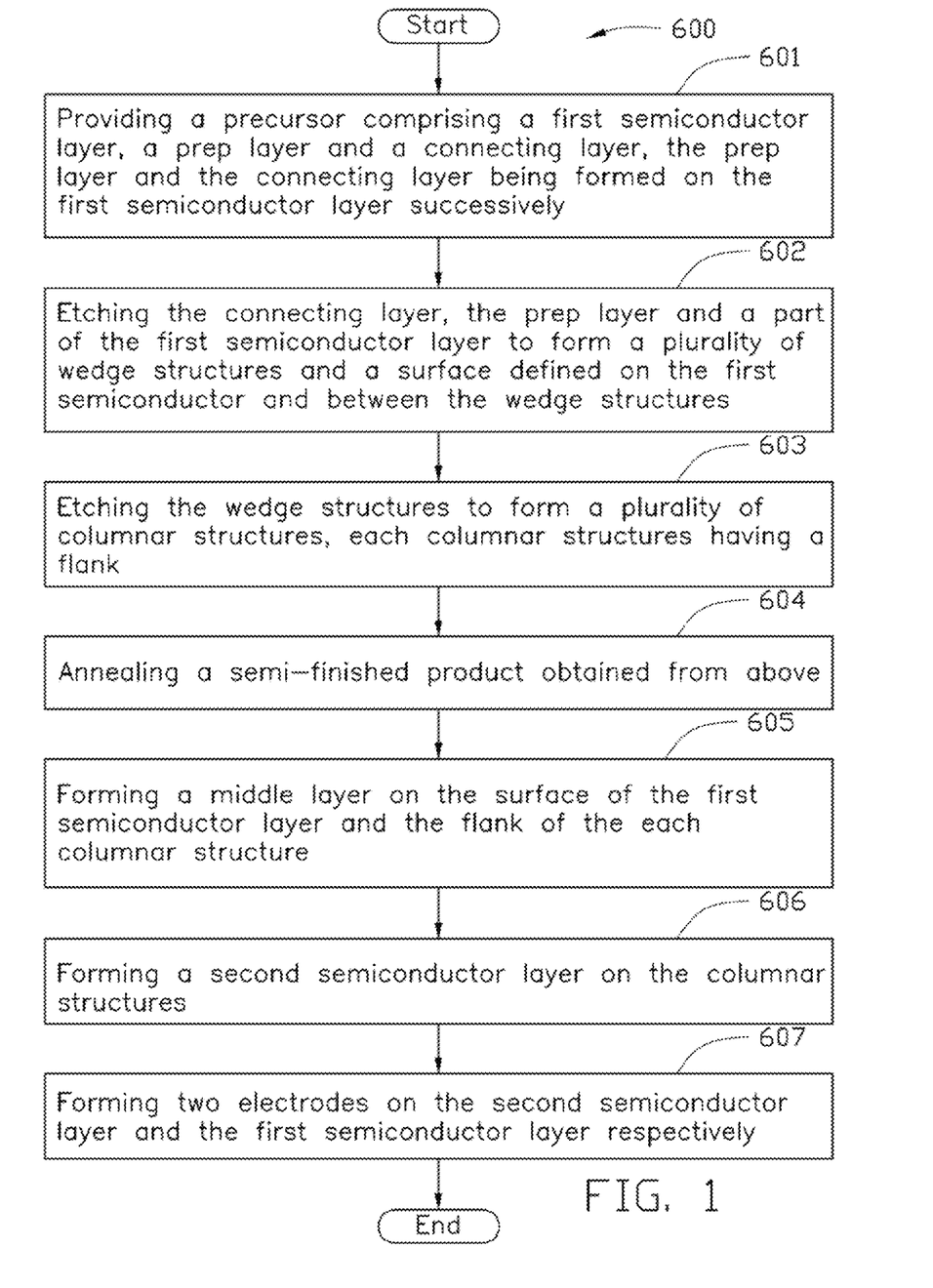
FIG. 1 is a flowchart of a method of manufacturing a single photon source die in accordance with an exemplary embodiment of the present disclosure.

Referring to FIG. 1, a flowchart is presented in accordance with an embodiment of a method of manufacturing a single photon source die. The method 600 is provided by way of example, as there are a variety of ways to carry out the method. The method 600 described below can be carried out using the configurations illustrated in FIGS. 2-12, for example, and various elements of these figures are referenced in explaining the method 600. Each block shown in FIG. 1 represents one or more process, method, or subroutines, carried out in the method 600. Furthermore, the illustrated order of blocks is illustrative only and the order of the blocks can be changed. Additional blocks can be added or fewer blocks may be utilized without departing from this disclosure. The method 600 can begin at block 601.

Figure 2:
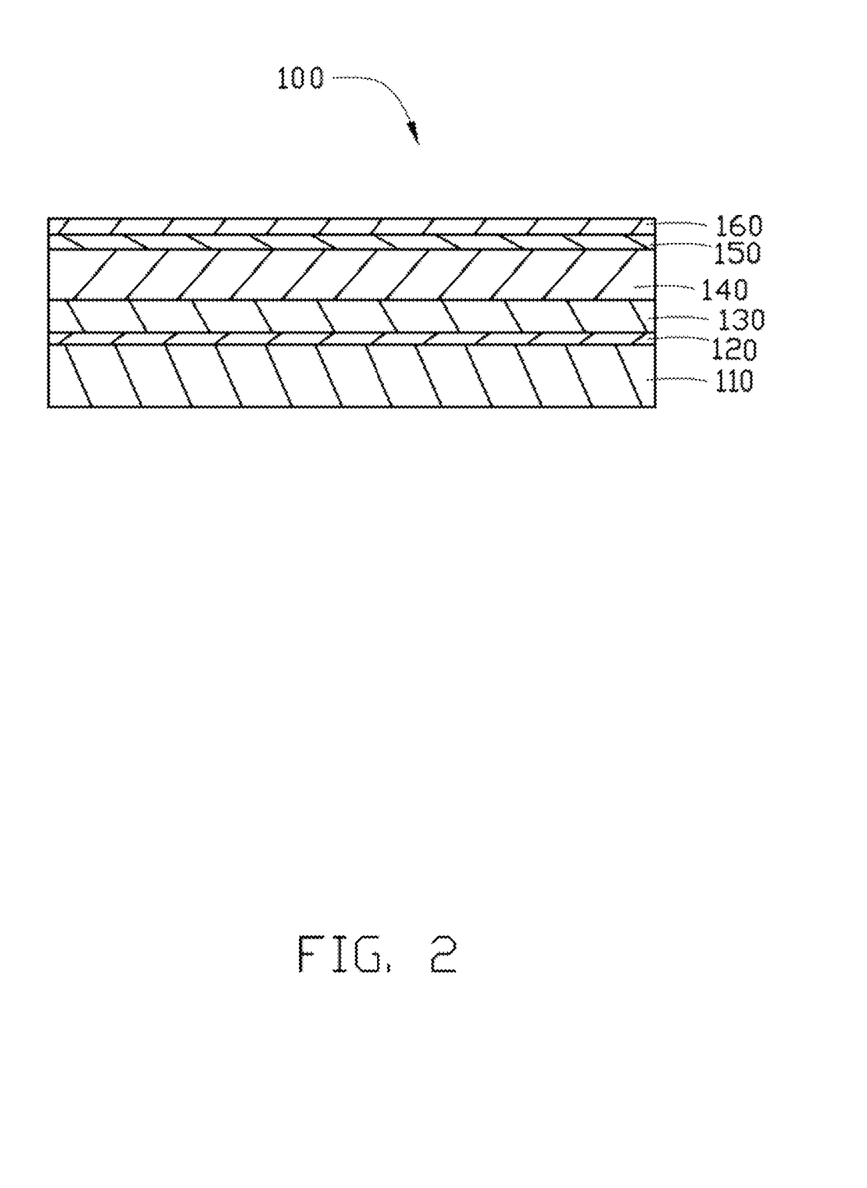
FIG. 2 is a cross-sectional view showing a first semi-finished single photo source die processed by the method of FIG. 1 in accordance with an embodiment of the present disclosure.

At block 601, a precursor 100 is provided. The precursor 100 comprises a first semiconductor layer 140, a prep layer 150 and a connecting layer 160. The prep layer 150 and the connecting layer 160 are formed on the first semiconductor layer 140 successively. In at least one embodiment, the precursor 100 can also comprise a substrate 110, a first buffer layer 120 and a second buffer layer 130. FIG. 2 illustrates that the first buffer layer 120, the second buffer layer 130, the first semiconductor layer 140, the prep layer 150 and the connecting layer 160 are successively formed on the substrate 110.

The substrate 110 can be made of sapphire, silicon carbide (SiC), silicon (Si), or gallium nitride (GaN), etc.

The first buffer layer 120 is formed on the substrate 110. The first buffer layer 120 can be a low-temperature un-doped GaN layer. A range of temperature of growing the first buffer layer 120 can be from 500° C. to 600° C.

The second buffer layer 130 is formed on the first buffer layer 120. The second buffer layer 130 can be a high-temperature un-doped GaN layer. A range of temperature of growing the second buffer layer 130 can be from 1000° C. to 1100° C.

The first semiconductor layer 140 is formed on the second buffer layer 130. The first semiconductor layer 140 can be an n-type GaN layer.

The prep layer 150 is formed on the first semiconductor layer 140. The prep layer 150 can be a quantum well layer. The prep layer 150 can be made of $In_xGa_{1-x}N$ ($0<x\leq1$). The x can be equal to 1, the prep layer is made of InN. A thickness of the prep layer 150 can be less than or equal to 100 nm. In at least one embodiment, the thickness of the prep layer 150 can be about 2 nm.

The connecting layer 160 is formed on the prep layer 150. The connecting layer 160 can be made of $Al_yGa_{1-y}N$ ($0\leq y\leq1$).

The y can be equal to zero, the connecting layer 160 is made of GaN. The y can be equal to 1, the connecting layer 160 is made of AlN.

Figure 3:
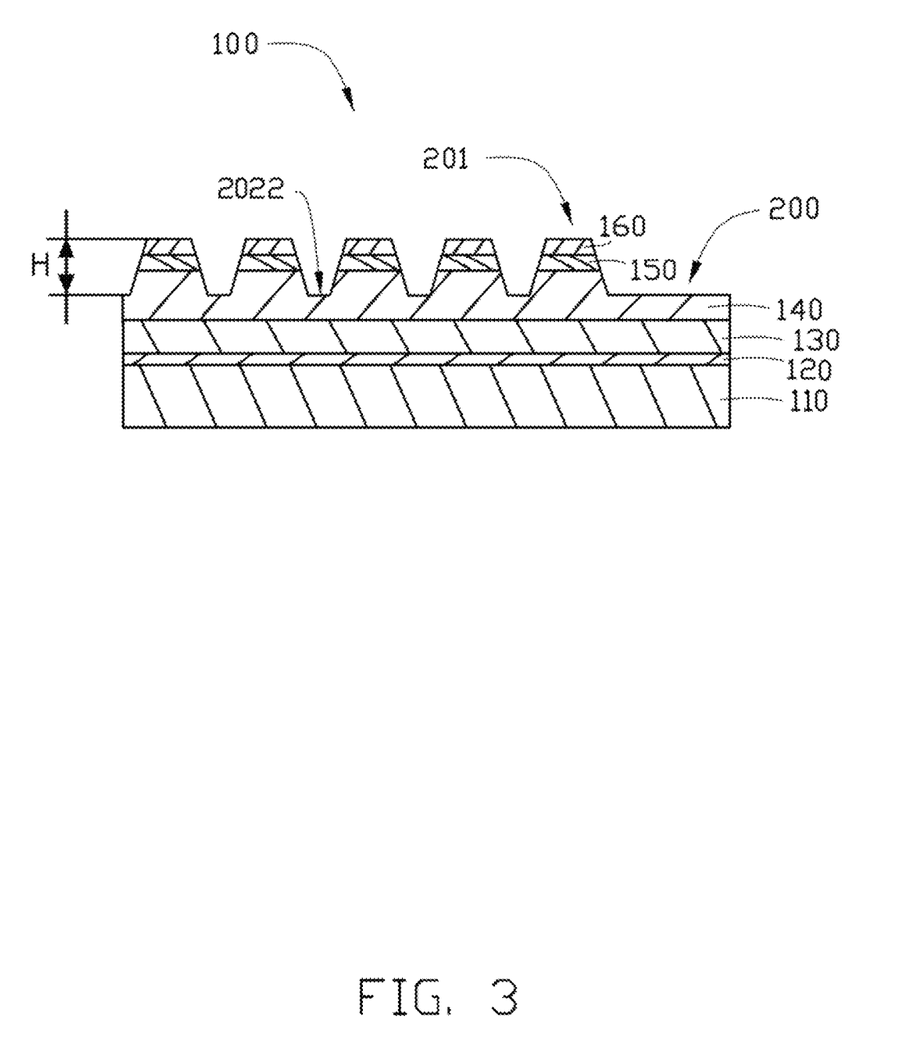
FIG. 3 is a cross-sectional view showing a second semi-finished single photo source die processed by the method of FIG. 1 in accordance with an embodiment of the present disclosure.
Figure 4:
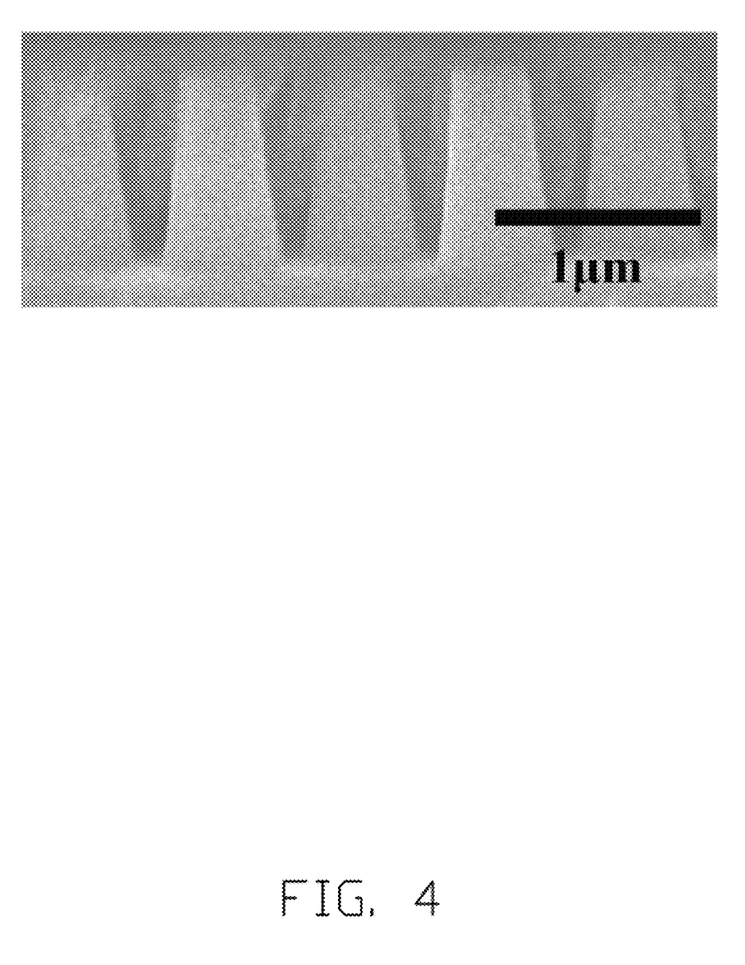
FIG. 4 is a scanning electron microscope (SEM) image of wedge structures of the semi-finished single photon source die of FIG. 3.

At block 602, the connecting layer 160, the prep layer 150 and a part of the first semiconductor layer 140 are etched to form a first surface 200, a second surface 2022 and a plurality of wedge structures 201. The connecting layer 160, the prep layer 150 and the first semiconductor layer 140 can be etched by lithography etching or nanoimprint lithography, etc. The first surface 200, the second surface 2022 and wedge structures 201 are formed by etching. FIG. 3 illustrates that the first surface 200 and the second surface 2022 are defined in the first semiconductor layer 140. The first surface 200 can be placed in a corner of the first semiconductor layer 140. The wedge structures 201 are separate from each other. The second surface 2022 are placed between the wedge structures 201. Each wedge structure 201 comprises a protruding part of the semiconductor layer 140, the prep layer 150 and the connecting layer 160 on the protruding part of the semiconductor layer 140. Diameters of the bottom layer 141, the prep layer 150 and the connecting layer 160 reduce in turn. The diameter of the bottom layer 141 is larger than that of the prep layer 150. The diameter of the prep layer 150 is larger than that of the connecting layer 160. A height H of each wedge structure 201 can be from 0.2 μm to 1 μm. In at least one embodiment, the height H of each wedge structure 201 can be 0.5 μm. FIG. 4 shows a scanning electron microscope (SEM) image of wedge structures 201.

Figure 5:
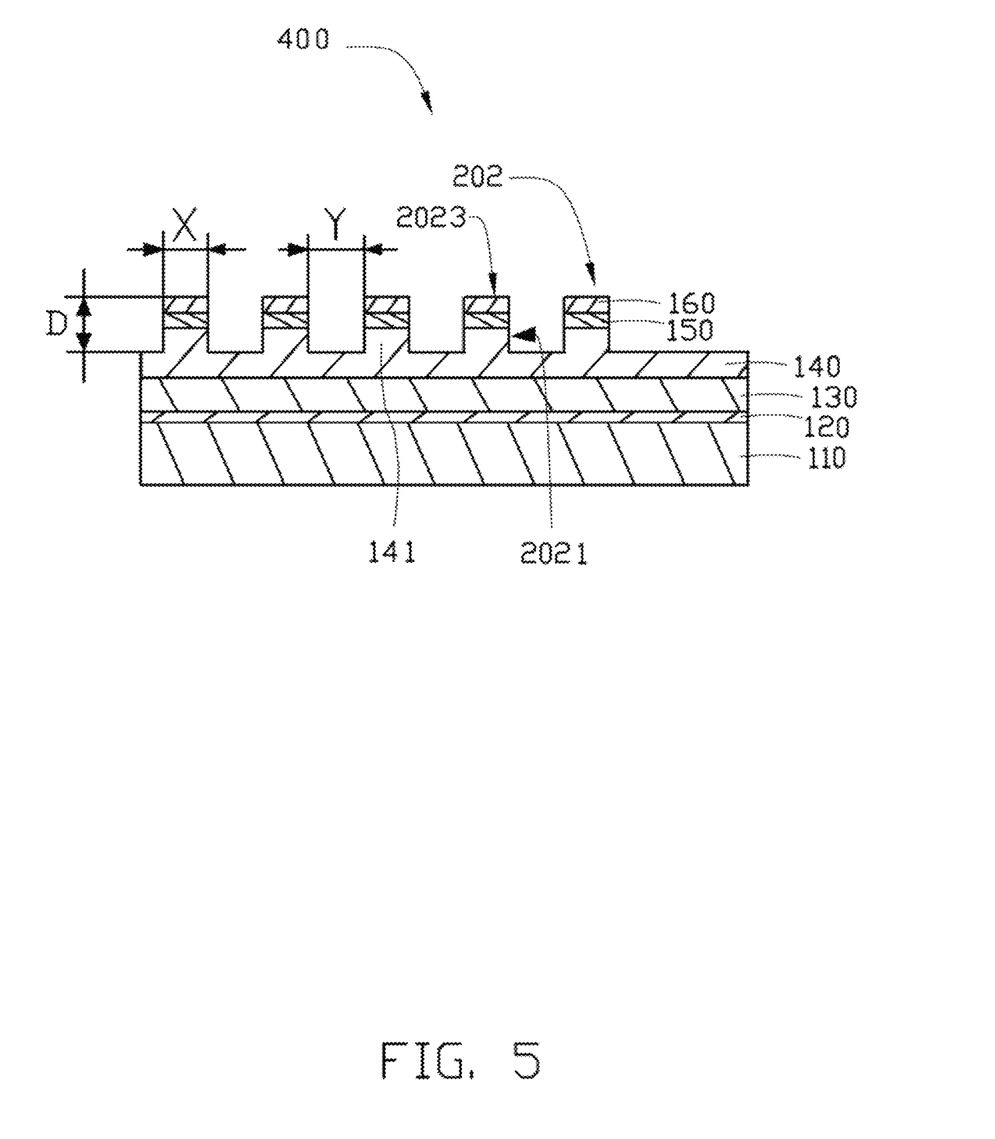
FIG. 5 is a cross-sectional view showing a third semi-finished single photo source die processed by the method of FIG. 1 in accordance with an embodiment of the present disclosure.
Figure 6:
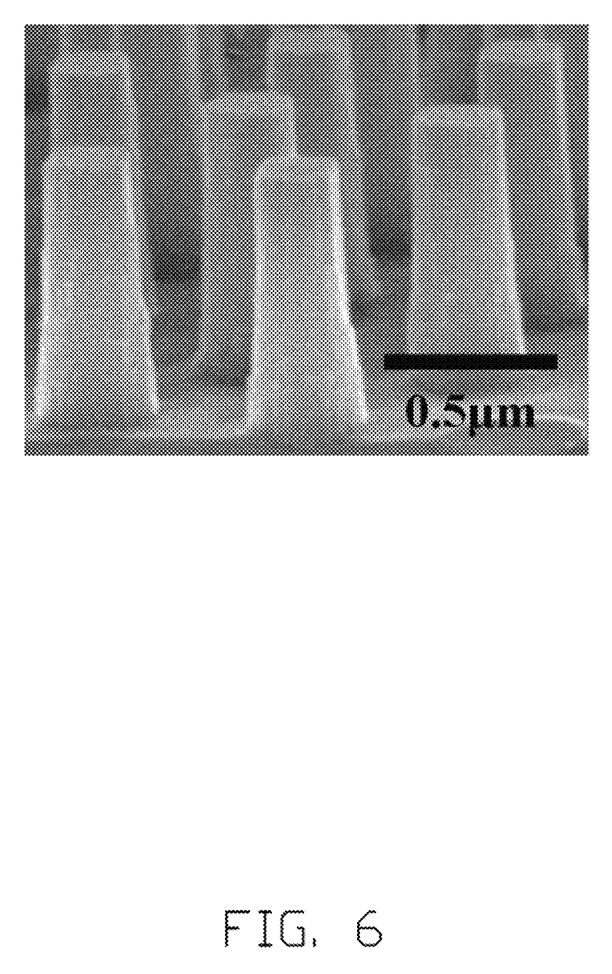
FIG. 6 is a SEM image of a side view of columnar structures of the semi-finished single photon source die of FIG. 5.
Figure 7:
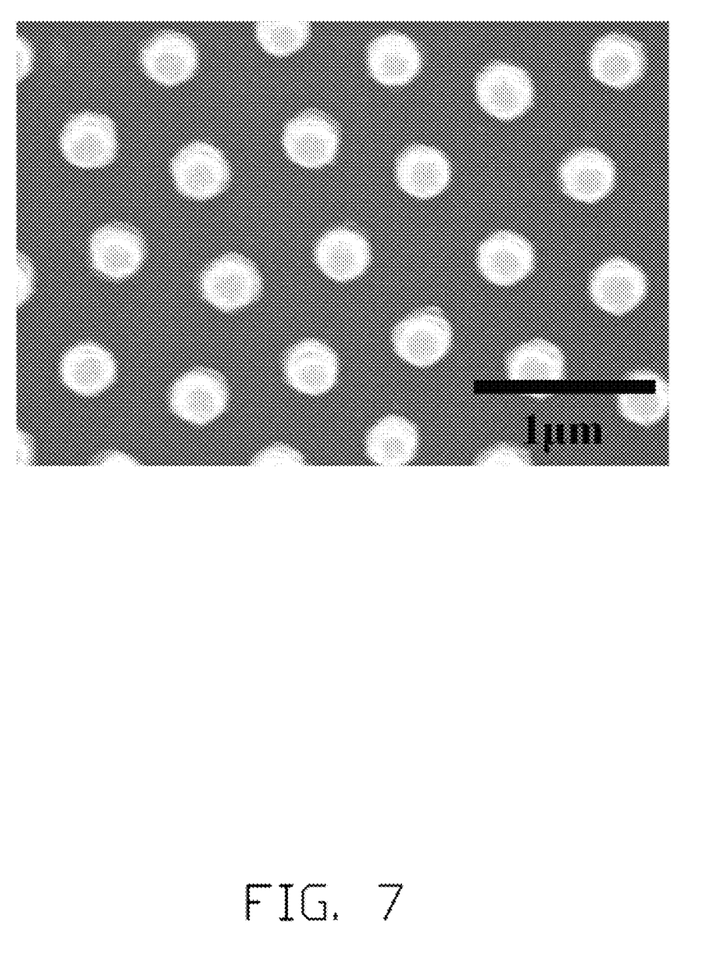
FIG. 7 is a SEM image of a top view of columnar structures of the semi-finished single photon source die of FIG. 5.
Figure 8:
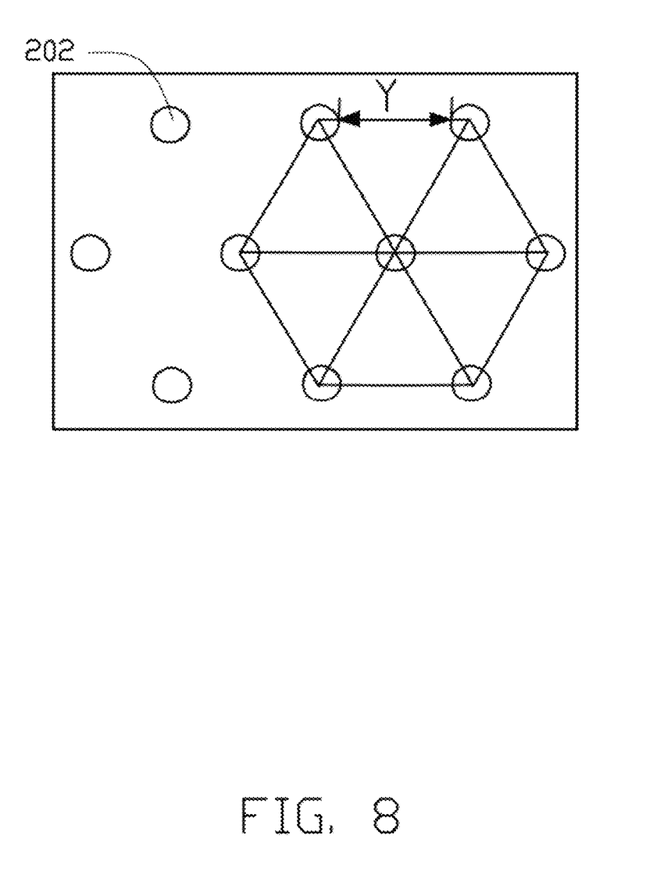
FIG. 8 is a first diagrammatic map of columnar structures of the semi-finished single photon source die of FIG. 5.
Figure 9:
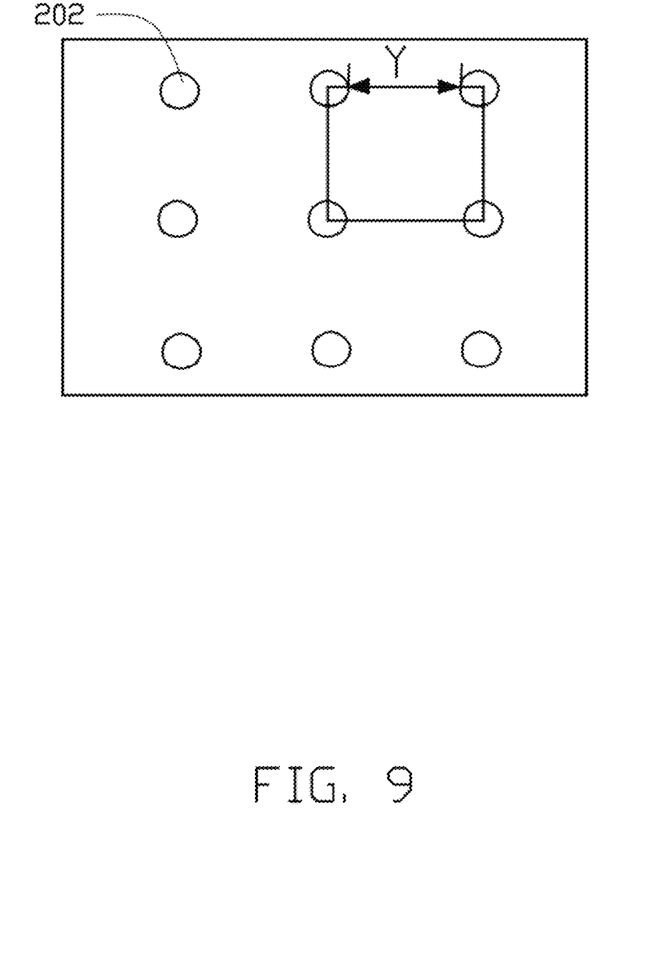
FIG. 9 is a second diagrammatic map of columnar structures of the semi-finished single photon source die of FIG. 5.
Figure 10:
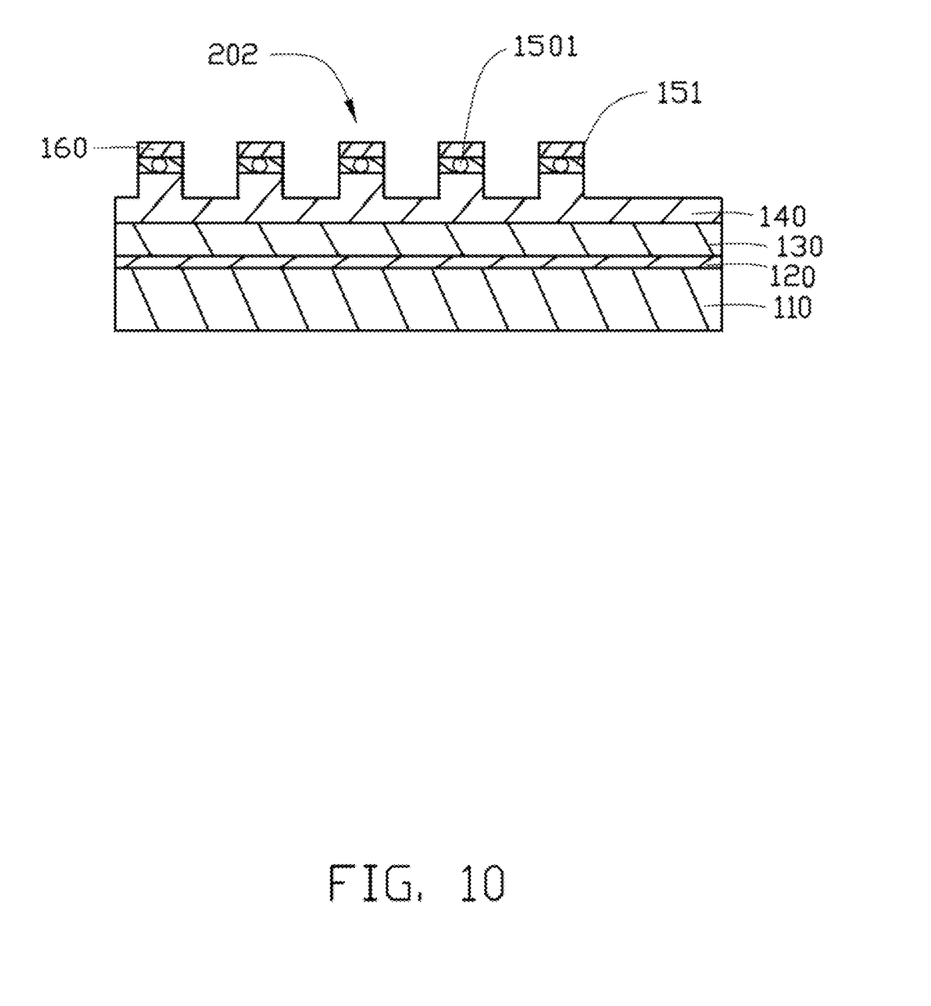
FIG. 10 is a cross-sectional view showing a fourth semi-finished single photo source die processed by the method of FIG. 1 in accordance with an embodiment of the present disclosure.

At block 603, the wedge structures 201 are etched to form columnar structures 202. A semi-finished product 400 can be obtained as shown in FIG. 5. A top surface 2023 and a flank 2021 are defined on each columnar structure 202. Each columnar structure 202 comprises a bottom layer 141, a prep layer 150 and a connecting layer 160. The bottom layer 141 of each columnar structure 202 is each protruding part of the first semiconductor layer 140 after etched. The bottom layer 141 has a same material as the first semiconductor 140. The prep layer 150 and the connecting layer 160 are formed on the bottom layer 141 successively. Diameters of the bottom layer 141 and the prep layer 150 is approximately equal to a diameter of the connecting layer 160. In at least one embodiment, the etching solution can be potassium hydroxide (KOH) solution. FIG. 6 shows a SEM image of a side view of columnar structures 200. FIG. 7 shows a SEM image of a top view of columnar structures 200. A height D of each columnar structure 202 can be from 0.2 μm to 1 μm. A width X of each columnar structure 202 can be less than or equal to 100 nm. In at least one embodiment, columnar structures 202 are a hexagonal close-packed (see FIG. 8). In at least another embodiment, columnar structures 202 are a square arrangement (see FIG. 9). A distance Y between two adjacent columnar structures 202 can be from 50 nm to 500 nm. In at least one embodiment, the distance Y between two adjacent columnar structures 202 can be 200 nm.

At block 604, the semi-finished product 400 is annealed in $NH_3$ environment. During annealing, a solubility of element In (indium) of $In_xGa_{1-x}N$ (0<x≤1) of the prep layer 150 decreases, a part of element In precipitates out from $In_xGa_{1-x}N$ (0<x≤1) and generates to a plurality of indium enrichment areas, and $In_xGa_{1-x}N$ (0<x≤1) of the prep layer 150 changes to a $In_zGa_{1-z}N$ (0<z≤1). The prep layer 150 transforms into a new layer, illustrated as a single photon point layer 151 in FIG. 10, and the single photon point layer 151 is made of $In_zGa_{1-z}N$ (0<z≤1). The single photon point layer 151 comprises a plurality of single photon points 1501 (see FIG. 10). The single photon points 1501 are the indium enrichment areas generated during annealing. A range of annealing temperature can be from 700° C. to 900° C., a range of annealing time can be from 1 min to 5 min, and a range of annealing pressure can be from 50 torr to 760 torr. In at least one embodiment, the annealing temperature can be 750° C., the annealing time can be 2 min, and the annealing pressure can be 500 torr.

Figure 11:
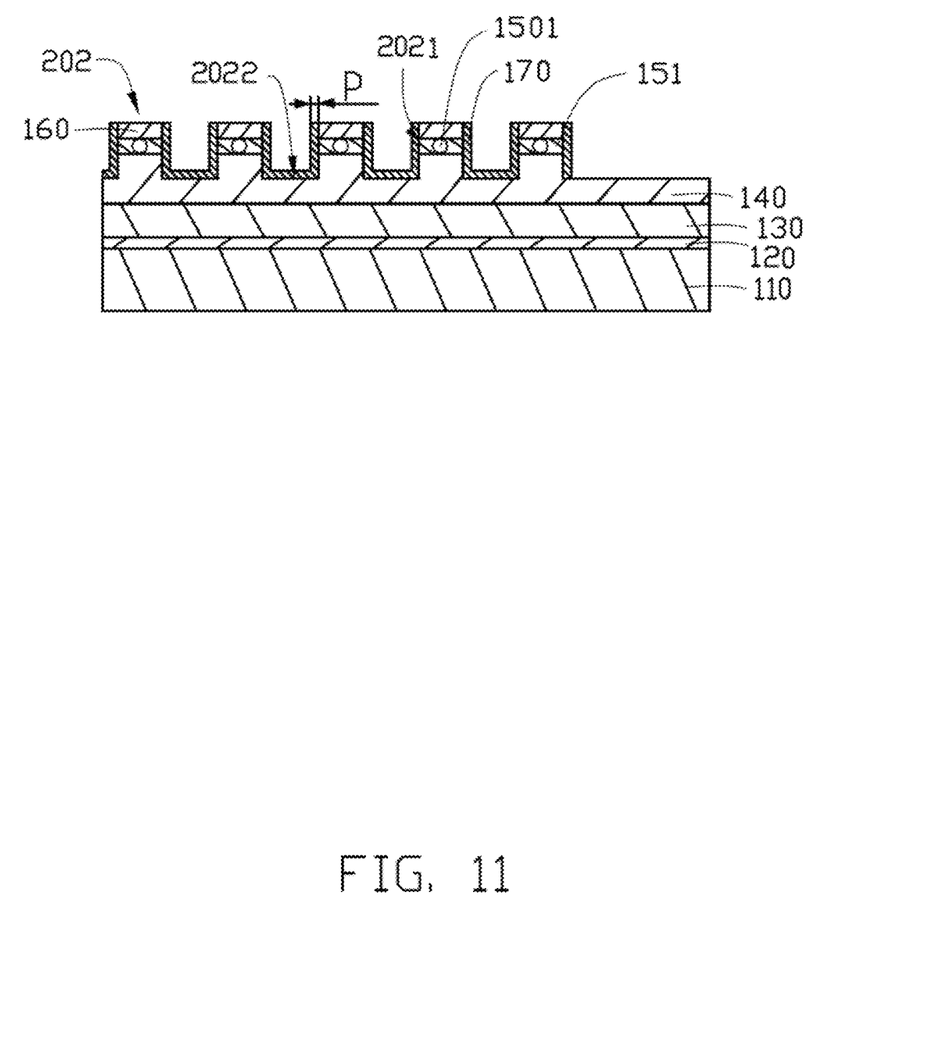
FIG. 11 is a cross-sectional view showing a fifth semi-finished single photo source die processed by the method of FIG. 1 in accordance with an embodiment of the present disclosure.

At block 605, a middle layer 170 is formed on the second surface 2022 of the first semiconductor layer 140 and formed out of the flank 2021 of each columnar structure 202 (see FIG. 11). The middle layer 170 is a dielectric layer. The middle layer 170 can be an oxide layer. In at least one embodiment, the middle layer 170 can be made of $SiO_mN_n$. The middle layer 170 has a uniform thickness. The thickness P of the middle layer 170 can be from 10 nm to 30 nm. In at least one embodiment, the thickness P of the middle layer 170 can be 15 nm.

At block 606, a second semiconductor layer 180 is formed on the columnar structures 202.

The second semiconductor layer 180 is formed on the top surfaces 2023 of the columnar structures 202. The second semiconductor layer 180 can be a p-type GaN layer. During a process of growing the second semiconductor layer 180, the second semiconductor layer 180 can grow on the top surfaces 2023 of the columnar structures 202 along a direction from the substrate 110 to the columnar structures 202 initially and then grow along a direction parallel to the substrate 110 to form the second semiconductor layer 180 on the top surfaces 2023 of the columnar structures 202.

In at least one embodiment, a space 171 is defined among the first semiconductor layer 140, the second semiconductor 180 and the middle layer 170 of the columnar structures 202. In at least one embodiment, the space 171 can be filled with the same material as the middle layer 170 (not shown).

Figure 12:
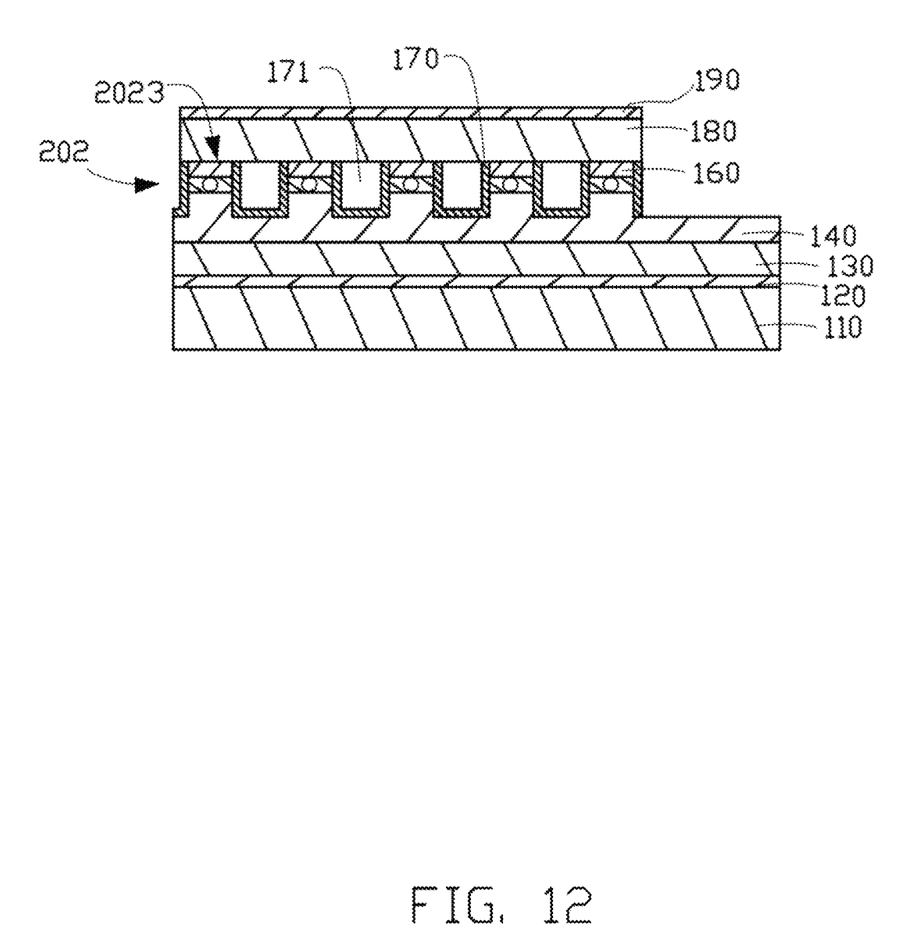
FIG. 12 is a cross-sectional view showing a sixth semi-finished single photo source die processed by the method of FIG. 1 in accordance with an embodiment of the present disclosure.

A conducting layer 190 can be formed on the second semiconductor layer 180. The conducting layer 190 can be an indium tin oxide (ITO) layer. FIG. 12 illustrates that the second semiconductor layer 180 and the conducting layer 190 are formed on the top surface 2023 of the columnar structure 202 successively.

Figure 13:
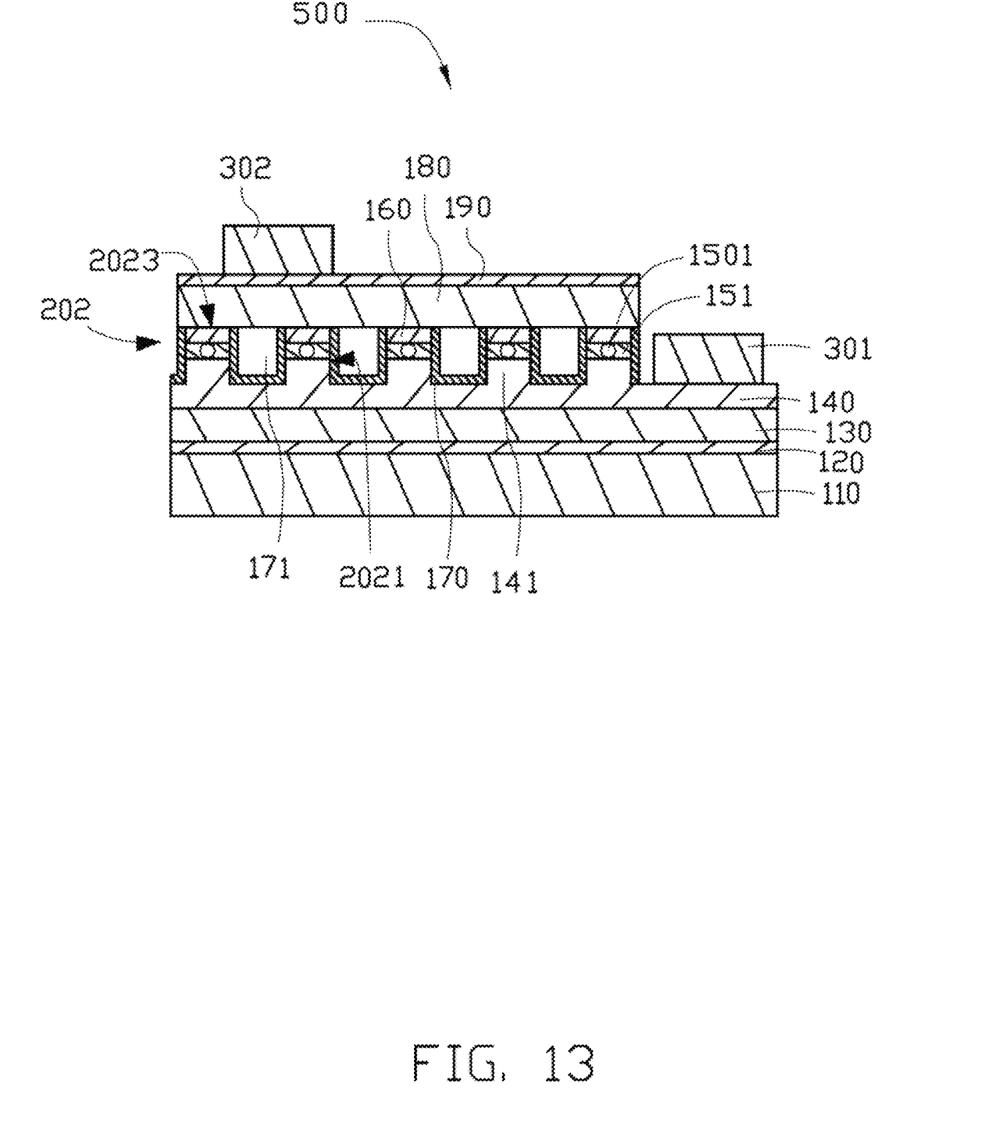
FIG. 13 is a cross-sectional view section of the single photon source die obtained by the method of FIG. 1.

At block 607, two electrodes 301, 302 are formed on the second semiconductor 180 and the first semiconductor layer 140, respectively. FIG. 13 illustrates that the first electrode 301 is formed on the first surface 200 of the first semiconductor layer 140, and the second electrode 302 is formed on the conducting layer 190.

Referring to FIG. 13, a single photon source die 500 is also provided in the present disclosure. The single photon source die 500 comprises a first semiconductor layer 140, a plurality of columnar structure 202, and a second semiconductor layer 180. The columnar structure 202 and the second semiconductor layer 180 are formed on the first semiconductor layer 140 successively. In at least one embodiment, the single photon source die 500 can also comprise a substrate 110, a first buffer layer 120 and a second buffer layer 130. The first buffer layer 120, the second buffer layer 130 and the first semiconductor layer 140, the columnar structure 202 and the second semiconductor layer 180 can be formed on the substrate 110 successively.

The substrate 110 can be made of sapphire, silicon carbide (SiC), silicon (Si), or gallium nitride (GaN), etc.

The first buffer layer 120 is formed on the substrate 110. The first buffer layer 120 can be a low-temperature un-doped GaN layer. A range of temperature of growing the first buffer layer 120 can be from 500° C. to 600° C.

The second buffer layer 130 is formed on the first buffer layer 120. The second buffer layer 130 can be a high-temperature un-doped GaN layer. A range of temperature of growing the second buffer layer 130 can be from 1000° C. to 1100° C.

The first semiconductor layer 140 is formed on the second buffer layer 130. The first semiconductor layer 140 can be an n-type GaN layer.

A top surface 2023 and a flank 2021 are defined in each columnar structure 202. Each columnar structure 202 comprising a bottom layer 141, a single photon point layer 151 and a connecting layer 160. The bottom layer has a same material as the first semiconductor 140. The single photon point layer 151 and the connecting layer 160 are formed on the bottom layer 141 successively. The single photon point layer 151 can be made of $In_zGa_{1-z}N$ ($0<z\leq 1$). The single photon point layer 151 comprises a plurality of single photon points 1501. The connecting layer 160 is coupled to the second semiconductor layer 180. The connecting layer 160 can be made of $Al_yGa_{1-y}N$ ($0\leq y\leq 1$).

The second semiconductor layer 180 is formed on the top surfaces 2023 of the columnar structures 202. The second semiconductor layer 180 can be a p-type GaN layer.

A conducting layer 190 can be formed on the second semiconductor 180. The conducting 190 can be an indium tin oxide (ITO) layer.

A first electrode 301 is formed on the first surface 200 of the first semiconductor layer 140. A second electrode 302 is formed on the conducting layer 190.

A middle layer 170 is formed on the second surface 2022 of the first semiconductor layer 140 and formed out of the flanks 2021 of the columnar structures 202. The middle layer 170 is a dielectric layer. The middle layer 170 can be an oxide layer. In at least one embodiment, the middle layer 170 can be made of $SiO_mN_n$.

In at least one embodiment, a space 171 is defined among the first semiconductor layer 140, the second semiconductor 180 and the middle layer 170 of the columnar structures 202. In at least one embodiment, the space 171 can be also filled with the middle layer 170 (not shown).

It is to be further understood that even though numerous characteristics and advantages have been set forth in the foregoing description of embodiments, together with details of the structures and functions of the embodiments, the disclosure is illustrative only; and that changes may be made in detail, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of a single photon source die and a method of manufacturing a single photon source die. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A method of manufacturing a single photon source die comprising:

providing a precursor comprising a first semiconductor layer, a prep layer and a connecting layer, the prep layer and the connecting layer being formed on the first semiconductor layer successively;

etching the connecting layer, the prep layer and a part of the first semiconductor layer to form a plurality of wedge structures and a surface defined on the first semiconductor and between the wedge structures;

etching the wedge structures to form a plurality of columnar structures, each columnar structures having a flank;

annealing a semi-finished product obtained from above;

forming a middle layer on the surface of the first semiconductor layer and the flank of the each columnar structure;

forming a second semiconductor layer on the columnar structures; and forming two electrodes on the second semiconductor layer and the first semiconductor layer respectively.

2. The method of claim 1, wherein the precursor further comprises a substrate, a first buffer layer and a second buffer layer, the first buffer layer, the second buffer layer, the first semiconductor layer, the prep layer and the connecting layer are formed on the substrate successively.

3. The method of claim 1 further comprises a conducting layer, and the conducting layer is formed on the second semiconductor layer.

4. The method of claim 1, wherein the prep layer is made of $In_xGa_{1-x}N$ ($0<x\leq 1$).

5. The method of claim 1, wherein the prep layer is less than or equal to 100 nm.

6. The method of claim 1, wherein the connecting layer is made of $Al_yGa_{1-y}N$ ($0\leq y\leq 1$).

7. The method of claim 1, wherein each wedge structure comprises a part of the semiconductor layer, the prep layer and the connecting layer.

8. The method of claim 1, wherein a height of each wedge structure is from 0.2 μm to 1 μm.

9. The method of claim 1, wherein a height of each columnar structure is from 0.2 μm to 1 μm.

10. The method of claim 1, wherein a width of each columnar structure is less than or equal to 100 nm.

11. The method of claim 1, wherein a distance between two adjacent columnar structures is from 50 nm to 500 nm.

12. The method of claim 1, wherein the semi-finished product is annealed in $NH_3$ environment.

13. The method of claim 1, wherein the prep layer changes to a single photon point layer, the single photon point layer comprises a plurality of single photon points.

14. The method of claim 1, wherein a thickness of the middle layer is from 10 nm to 30 nm.

15. The method of claim 1, wherein a space is defined among the first semiconductor layer, the second semiconductor and the middle layer of the columnar structures.

16. The method of claim 15, wherein the space is filled with a same material of the middle layer.

17. A single photon source die, comprising:
a first semiconductor layer;
a plurality of columnar structures formed on the first semiconductor layer; and
a second semiconductor layer formed on the columnar structures;
wherein each columnar structure comprising a bottom layer, a single photon point layer and a connecting layer, the single photon point layer comprising a plurality of single photon points.

18. The single photon source die of claim 17, wherein the bottom layer has a same material as the first semiconductor layer.

19. The single photon source die of claim 17, wherein a middle layer is formed on a surface of the first semiconductor layer and a flank of each columnar structure.

20. The single photon source die of claim 17, wherein the bottom layer is formed on and extends from the first semiconductor layer, and the second semiconductor layer is formed on the connecting layer.

* * * * *